United States Patent
Liou et al.

(10) Patent No.: US 8,846,528 B2
(45) Date of Patent: Sep. 30, 2014

(54) METHOD OF MODIFYING A LOW K DIELECTRIC LAYER HAVING ETCHED FEATURES AND THE RESULTING PRODUCT

(75) Inventors: Joung-Wei Liou, Zhudong Town (TW); Chung-Chi Ko, Nantou (TW); Chia-Cheng Chou, Keelung (TW); Keng-Chu Lin, Ping-Tung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 97 days.

(21) Appl. No.: 13/306,340

(22) Filed: Nov. 29, 2011

(65) Prior Publication Data

US 2013/0137261 A1    May 30, 2013

(51) Int. Cl.
   *H01L 21/44*    (2006.01)

(52) U.S. Cl.
   USPC .......................................................... 438/666

(58) Field of Classification Search
   None
   See application file for complete search history.

(56) References Cited

U.S. PATENT DOCUMENTS

| | | | | |
|---|---|---|---|---|
| 4,063,103 | A * | 12/1977 | Sumi | 372/3 |
| 5,580,615 | A * | 12/1996 | Itoh et al. | 438/676 |
| 6,346,488 | B1 * | 2/2002 | Kabansky | 438/783 |
| 2006/0157692 | A1 * | 7/2006 | Wada et al. | 257/40 |
| 2008/0311755 | A1 * | 12/2008 | Zin et al. | 438/700 |
| 2010/0028695 | A1 * | 2/2010 | Nguyen et al. | 428/450 |
| 2010/0029046 | A1 * | 2/2010 | Camacho et al. | 438/118 |
| 2010/0148232 | A1 * | 6/2010 | Ng et al. | 257/295 |

* cited by examiner

*Primary Examiner* — Scott B Geyer
(74) *Attorney, Agent, or Firm* — Lowe Hauptman & Ham, LLP

(57) ABSTRACT

A dielectric layer having features etched thereon and a low dielectric constant, and that is carried by a semiconductor substrate. The etched dielectric layer is modified so its surface energy is reduced by at least one of: (a) applying thermal energy to the layer to cause the layer temperature to be between 100 C and 400 C; (b) irradiating the layer with electromagnetic energy; and/or (c) irradiating the layer with free ions.

20 Claims, 3 Drawing Sheets

METHOD OF MODIFYING A LOW K DIELECTRIC LAYER HAVING ETCHED FEATURES AND THE RESULTING PRODUCT

BACKGROUND

As the technology nodes shrink in some integrated circuit (IC) designs, the spacing between hole vias and trenches continues to decrease. One process for etching hole vias and trenches into a dielectric layer is to place a photoresist over the surface of the dielectric layer and then etch the hole vias. The photoresist is removed and a second photoresist is placed over the etched dielectric layer and a second round of etching occurs to create either more hole vias or trenches. The twice etched dielectric layer is then subjected to wet stripping to remove the residual etchant materials and by-products of the etching process. To remove the wet stripping solution containing the residue and by-products from the dielectric layer, the assembly is rotated at high speed to cast off the solution.

However, the high speed rotation frequently causes the walls of the etched trenches to collapse. This line collapse phenomenon makes the collapsed trench unusable for metallization. Further, residual etchant and by-products remaining on the dielectric layer between the first and second etchings can prevent accurate creation of the desired features.

The use of dielectric materials having low dielectric constants of about 3.5 or less (i.e., low k dielectric materials) increases the above noted problems because of the low mechanical strength of low k dielectric materials. The purpose of a low k dielectric layer is to create lower parasitic capacitance between adjacent metal lines to provide faster circuit performance. The structural properties that cause the low k dielectrics to have the low parasitic capacitance also create the problem of low mechanical strength. Thus, as node size decreases the mechanical drawbacks of low k dielectric materials result in fewer usable connections within the dielectric layer.

BRIEF DESCRIPTION OF THE DRAWINGS

The present disclosure is best understood from the following detailed description when read with the accompanying figures. It is emphasized that, in accordance with standard practice in the industry various features may not be drawn to scale and are used for illustration purposes only. In fact, the dimensions of the various features in the drawings may be arbitrarily increase or reduced for clarity of discussion.

DESCRIPTION

It is understood that the following disclosure provides many different embodiments, or examples, for implementing different features. Specific examples of components and arrangements are described below to simplify the present disclosure. These are, of course, merely examples and are not intended to be limiting. For example, one of ordinary skill in the art may recognize steps for forming a semiconductor device may be added or removed from the recited steps without departing from the spirit of the invention.

Figure 1:
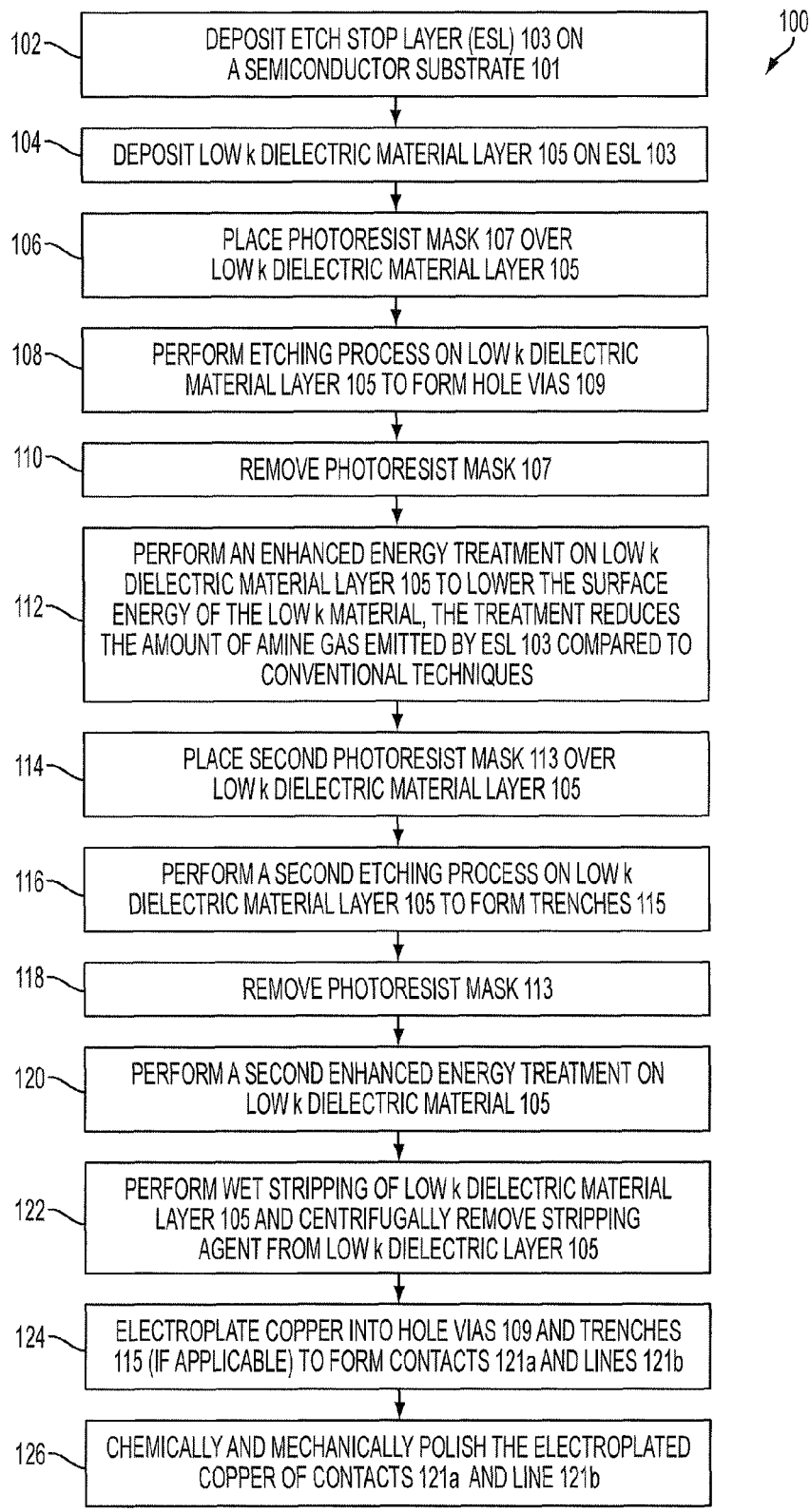
FIG. 1 is a flow chart of a method of making a semiconductor device having etched features in a low k dielectric layer.

FIG. 1 is a flowchart of a method 100 of making a semiconductor device including a semiconductor substrate 101 (FIG. 2a) carrying an enhanced low k layer having etched features. Method 100 begins with step 102 in which an etch stop layer (ESL) 103 is deposited on semiconductor substrate 101. In the embodiment of FIGS. 1 and 2a-2e, semiconductor substrate 101 is silicon. In other embodiments, the semiconductor substrate is any of silicon-germanium, gallium arsenide, or other materials. In the embodiment of FIGS. 1 and 2a-2e, ESL 103 is silicon nitride. In other embodiments, the ESL is any of silicon carbon nitride, silicon dioxide, silicon carbide optionally doped with nitrogen or oxygen, siliconoxynitride, or other materials. The method of deposition is any of chemical vapor deposition (CVD), physical vapor deposition (PVD), plasma enhanced CVD (PECVD), or other deposition methods.

The method continues with step 104 in which a low k dielectric (LKD) layer 105 is deposited on ESL 103. In the embodiment of FIGS. 1 and 2a-2e, LKD layer 105 is porous silicon dioxide (aerogel). In other embodiments, the LKD layer is any of carbon doped silicon oxide, carbon-containing dielectric materials optionally doped with nitrogen, hydrogen, oxygen or a combination thereof, organic dielectrics, or other materials known in the art. The LKD layer can be deposited using the same method as is employed for the ESL or a different method.

The method continues with step 106 in which a photoresist mask 107 is placed over a portion of LKD layer 105. Mask 107 includes openings corresponding with the geometry and position on the surface of LKD layer 105 of features to be etched on the LKD layer 105 so that a portion of the LKD layer where the features are not to be formed is covered by the mask and other portions of the LKD layer where the features are to be formed are not covered by the mask. In mask 107, the openings are cylinders 107a which enable hole vias (e.g. through hole vias or blind hole vias) to be etched in LKD layer 105. It is to be understood that in other embodiments the openings in mask 107 can have other shapes depending on the shape of the feature to be etched in the LKD layer 105; e.g., if a trench is to be etched in layer 105, the openings in the mask are long narrow parallelepipeds.

The material of photoresist mask 107 is matched to the material of LKD layer 105 in that the photoresist is resistant to the compound used to etch the LKD layer. In the embodiment of FIGS. 1 and 2a-2e, photoresist mask 107 is placed over LKD layer 105 using a photolithography process. In other embodiments, the photoresist mask is placed over the LKD layer using any one of printing, lithographic processes, or other methods.

In step 108, the portions of LKD layer 105 that are in registration with cylinders 107a (i.e., not covered by mask 107) are etched using an etchant to form features. The etched features in the method involving mask 107 are hole vias 109, as illustrated in FIG. 2a-2e. In other embodiments, trenches or other features can be formed by an etchant attacking the portions of the surface of LKD layer 105 not covered by mask 105

The compound used to etch the portion of LKD layer 105 that is not covered by photoresist mask 107 depends on the LKD material and the type of feature the etching is intended to create (e.g. hole via, trench, etc.). Hole vias 109 are formed by using an anisotropic etchant, while trenches are formed by using an isotropic etchant. In the embodiment of FIGS. 1 and 2a-2e, the etching process is a wet etching process. In other embodiments, the etching process is any of a dry etching process, a reactive ion etching process, a plasma etching process, or other methods known in the art. Upon completion of the etching process used to form the hole vias 109, the photoresist mask 107 deposited during step 106 is removed during step 110, to form the structure of FIG. 2*b* that included an exposed top face of LDK layer 107 with hole vias therein. In the embodiment of FIGS. 1 and 2*a*-2*e*, once etching is complete the photoresist is removed using a wet chemistry process. In other embodiments, the photoresist is removed by any one of a dry chemistry process, selective etching, plasma ashing, or other methods.

Following removal of photoresist mask 107, the surface of LKD layer 105 undergoes an enhanced energy treatment in step 112. It was found the enhanced energy treatment modifies or removes the etching by-products of step 108 and residual etchant of step 108.

Figure 2A:
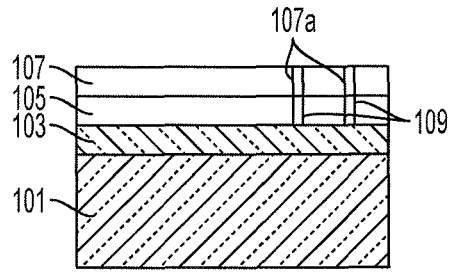
FIGS. 2a-2e are side sectional views of a semiconductor substrate at various stages of the process of FIG. 1.
Figure 2B:
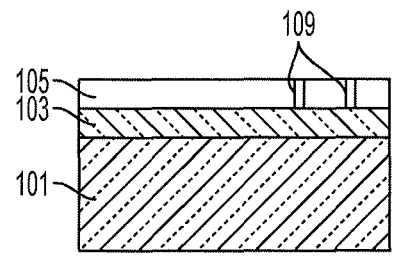

Removing the etching by-products and etchant residue lowers the surface energy of the etched LKD layer 105 of FIG. 2*b*. As the dimensions of integrated circuits decrease, the proximity of etched trenches and/or hole vias on the low k dielectric layer increases, i.e., adjacent trenches and/or hole vias on the low k dielectric layer get closer to each other. The combination of smaller dimensions and increased proximity results in thinner LKD walls between adjacent trenches and/or hole vias. In conventional etching processes, these thinner walls have low mechanical strength resulting in frequent line collapse during a wet stripping process.

The lower surface energy of LKD layer 105 resulting from enhanced energy treatment step 112 results in a lower bonding force (compared to conventional techniques) between the LKD layer and a wet stripping solution applied to LDK layer 105 during step 122. Thus, compared to conventional techniques, step 112 causes a decrease in the force exerted on the walls of LDK layer 105 during mechanical, centrifugal force removal of the stripping chemicals during step 122, resulting in fewer instances of line collapse. It was found the ratio of line collapse decreased from 24:52 using conventional techniques to 2:98 using an enhanced energy technique disclosed herein.

It was found there is substantial or complete prevention of the deposition of the etchant by-products and residual etchant on LKD layer 105 as a result of step 112 and that step 112 also causes a reduction in the amount of amine gas emanating from ESL 103 compared to conventional techniques. The amine gas forms deposits on exposed surfaces of the LKD layer. The deposits can (1) block hole vias to prevent effective metallization and/or (2) coat a surface of the LKD layer 105 to prevent additional etching during subsequent etching steps. As the dimensions of IC features decrease, the proximity of adjacent hole vias increases, i.e., adjacent hole vias are closer to each other. Deposits of etchant by-products caused by amine gas prevent adjacent hole vias from being formed in close proximity using conventional etching procedures. The reduction or prevention of the deposits through the enhanced energy treatments disclosed herein permits adjacent hole vias to be in greater proximity, facilitating the decrease in IC feature dimensions. It was found the yield of usable hole vias using the enhanced energy treatment increased by 20% over conventional manufacturing techniques.

In an embodiment, the enhanced energy treatment comprises a thermal treatment exposing the LKD layer to thermal energy, causing the LKD layer to be at a temperature between about 100° C. and about 400° C.; in at least some embodiments, the applied thermal energy causes the LKD layer to be at a temperature of about 200° C. In other embodiments, the applied thermal energy causes the LKD layer to be at a temperature between 190° C. and about 210° C. In one embodiment, during thermal exposure of substrate 101 in the condition illustrated in FIG. 2*b*, substrate 101 with LKD layer 105 is disposed in a controlled gas environment comprising nitrogen gas, hydrogen gas and optionally at least one inert noble gas. The inert noble gas is any of helium, argon, or other noble gases. In other embodiments, during thermal exposure the LKD is disposed in a vacuum chamber with a pressure below about 1 Torr.

In another embodiment, the enhanced energy treatment comprises irradiating the LKD layer 105 with electromagnetic radiation with a wavelength greater than about 300 nm. In some embodiments, the electromagnetic radiation has a wavelength between about 400 nm and about 1000 nm. In an embodiment, the source for the electromagnetic radiation is a halogen lamp. In other embodiments, the source for the electromagnetic radiation is any one of a xenon flash lamp, xenon short-arc lamp, super high-pressure UV lamp, high-pressure UV lamp, low-pressure UV lamp, rare gas fluorescent lamp, metal halide lamp, XeF laser, GaAs/GaAlAs laser or other sources.

In additional embodiments, the enhanced energy treatment comprises exposing the LKD to a combination of thermal energy and electromagnetic radiation. The electromagnetic radiation is applied simultaneously with the thermal energy or at a different time.

Figure 3:
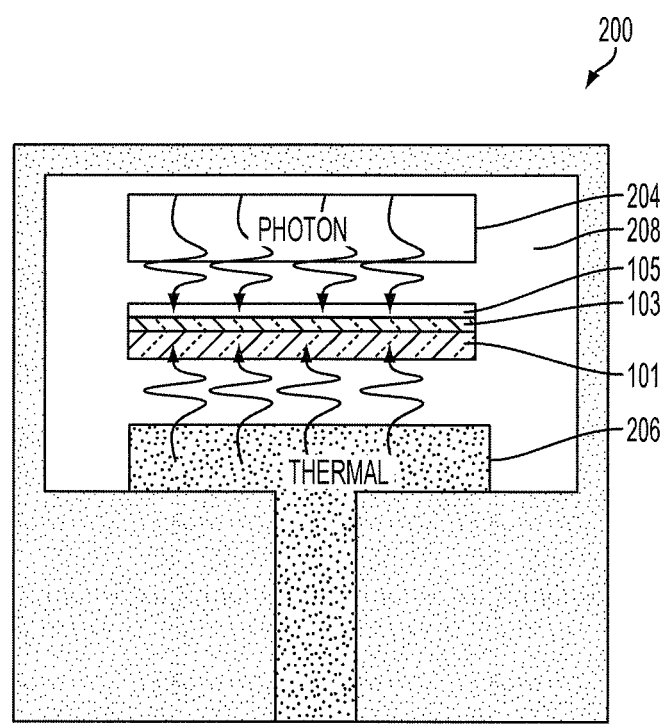
FIG. 3 is a schematic diagram of one embodiment of an enhanced energy treatment apparatus for performing at least one of the steps of FIG. 1.

FIG. 3 is a schematic diagram of an arrangement 200 wherein LKD layer 105 on semiconductor substrate 101 is exposed in vacuum chamber 208 to thermal energy and electromagnetic radiation simultaneously. The LKD layer 105 on substrate 101 is placed between a source 204 emitting electromagnetic radiation (photons) and a heater 206 emitting thermal energy so that the exposed surface of layer 105 faces radiation source 204 and the face of substrate 101 opposite layer 105 faces heater 206. The environment inside the chamber 208 is at a pressure less than 1 Torr and comprises nitrogen and hydrogen gas and can also include inert noble gases.

In other embodiments, the enhanced energy treatment comprises subjecting the LKD layer to a radical treatment so that the exposed surface of the LKD layer is irradiated with free ions. In an embodiment, the radical treatment includes a remote plasma treatment in a controlled gas environment comprising nitrogen gas, and hydrogen gas and optionally at least one inert noble gas. The remote plasma treatment bombards the exposed surface of the LKD layer with H+ ions. In other embodiments, the radical treatment is any of _N, He_, or other radical treatments.

In the embodiment of FIGS. 1 and 2*a*-2*e*, the duration of the enhanced energy treatment of step 112 is between about 1 minute and about 10 minutes; in at least some embodiments, the duration of the enhanced energy treatment in this embodiment is about 2 minutes.

Figure 2C:
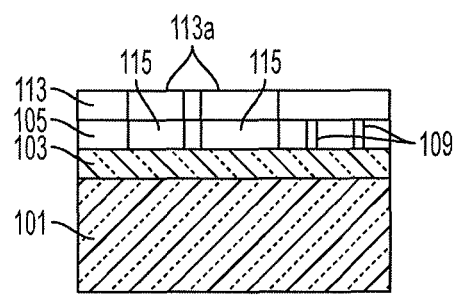

The method 100 jumps from step 112 to stripping step 122 if mask 107 included openings for all the features to be etched into layer 105. Alternatively, if additional features are to be etched in layer 105, method 100 continues to step 114, in which a second photoresist mask 113 (FIG. 2*c*) is placed over the exposed surface of LKD layer 105. Mask 113 usually has an opening pattern different from the hole pattern of mask 107 and is illustrated in FIG. 2*c* as including elongated parallelepipeds 113*a*, corresponding with the geometry and positions on the exposed surface of layer 105 where trenches 115 (FIG. 2*c*) are to be etched during etching step 116. Again the material for the photoresist depends on the materials of the LKD layer and the etchant, as in step 106 above.

Figure 2D:
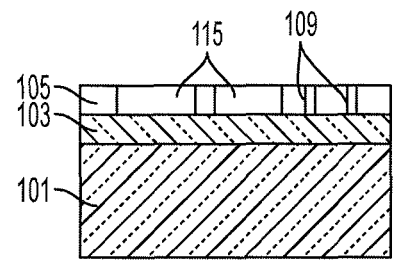
Figure 2E:
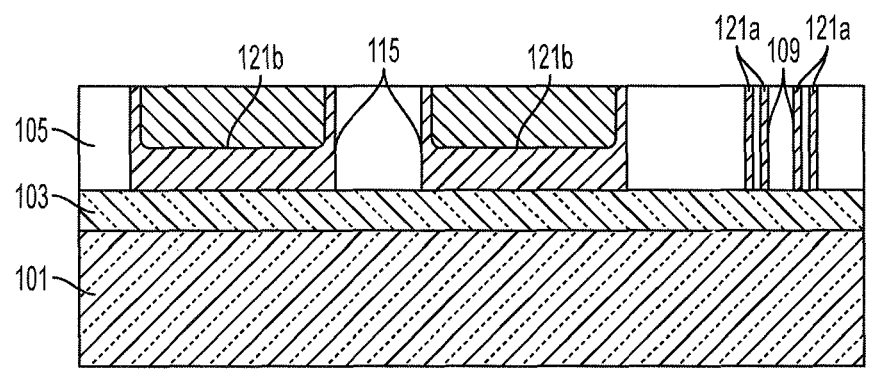

In step 116, the portions of the LKD layer 105 that are not covered by the second photoresist mask 113 are etched to form a second set of features and/or to modify some or all features of the first set of features formed during step 108. The second etching of step 116 can form the same features in the LKD layer as the first etching of step 108, but usually forms different features. Once the etching of step 116 is complete the second photoresist mask 111 is removed during step 118 and the upper face of layer 105 with via holes 109 and trenches 115 are exposed, as illustrated in FIG. 2d.

Following the removal of the second photoresist mask 113, the LKD layer_105 is subjected to a second enhanced energy treatment step 120. The second enhanced energy treatment of step 120 can be the same as the first enhanced energy treatment of step 112 or different. For example, the first enhanced energy treatment can comprise application of thermal energy and the second enhanced energy treatment can comprise application of thermal energy and electromagnetic radiation. Other combinations of enhanced energy treatments will be recognized by those of ordinary skill in the art.

After the second enhanced energy treatment of step 120 or after the first energy treatment of step 112, if steps 114-120 are not performed, wet stripping process 122 cleans the exposed surface of LKD layer 105 as well as the openings etched therein and the remainder of semiconductor substrate 101. The wet stripping process 118 comprises dipping substrate 101, as schematically illustrated in FIG. 2d, in a liquid chemical bath, then removing the substrate from the bath and then exerting an eccentric (i.e., centrifugal) force on the substrate to remove the wet cleaning agent. Those of ordinary skill in the art will recognize that additional steps can be incorporated in the wet stripping process.

Following the stripping process of step 122, the LKD layer 105 undergoes metallization in step 124 to form metal contacts 121a in hole vias 109 and metal lines 121b in trenches 115 (FIG. 2e) on the etched surfaces of the LKD layer. The metal used during metallization is any of copper, aluminum, combinations thereof and/or other materials. The metallization process is any of CVD, PVD, electroplating, or other methods known in the art.

In step 126, substrate 101 and the structures carried by the substrate_undergo chemical and mechanical polishing (CMP) to remove excess metal from the surface of the LKD layer 105 and from the features 109 and 115 etched thereon, as well as from the metal layers of contacts 121a and lines 121b. In an embodiment, where the metal used is copper, CMP is performed using benzotriazole (BTA) in combination with mechanical polishing. In other embodiments, CMP uses slurries or other materials.

One aspect of the description relates to a method of modifying a dielectric layer having (i) features etched thereon and (ii) a low dielectric constant, the layer being carried by a semiconductor substrate, wherein the method comprises reducing the surface energy of the layer. Another aspect relates to a method of modifying a dielectric layer having (i) features etched thereon and (ii) a low dielectric constant, the layer being carried by a semiconductor substrate, wherein the method comprises performing at least one of: (a) applying thermal energy to the layer to cause the layer temperature to be between 100 C and 400 C; (b) irradiating the layer with electromagnetic energy; and (c) irradiating the layer with free ions. A further aspect concerns a method of making a semiconductor device, wherein the method comprises: depositing an etch stop layer on a semiconductor substrate; depositing a low k dielectric material layer on the etch stop layer; covering a portion of the low k dielectric material layer with a photoresist mask; etching uncovered portions of the low k dielectric material layer to form etched features in the etched low k dielectric material; lowering surface energy of the etched low k dielectric material; and substantially preventing deposits resulting from by-products of the etching step from forming on the etched low k dielectric material layer. The description also relates to products formed by the methods.

The above description discloses exemplary steps, but they are not necessarily required to be performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

The invention claimed is:

1. A method of modifying a dielectric layer having (i) features etched thereon and (ii) a low dielectric constant, the layer being carried by a semiconductor substrate, the method comprising:
    reducing the surface energy of the layer by applying a treatment while the etched features having first dimensions are exposed, wherein applying the treatment comprises irradiating the layer with electromagnetic energy having a wavelength greater than about 300 nanometers (nm); and
    metallizing the etched features having the first dimensions.

2. The method of claim 1, wherein applying the treatment further comprises performing at least one of:
    (a) applying thermal energy to the layer to cause the layer temperature to be between 100 C and 400 C;
    (b) irradiating the layer with free ions.

3. The method of claim 2, wherein step (a) is performed.

4. The method of claim 2, wherein step (a) is performed, and
    the thermal energy causes the layer temperature to be between about 190 C and about 210 C.

5. The method of claim 2, wherein step (b) is performed, and the layer is irradiated with H+ ions.

6. The method of claim 2, wherein only one of steps (a) or (b) is performed.

7. The method of claim 2, wherein step (a) is performed simultaneously with irradiating the layer with electromagnetic energy.

8. The method of claim 2, wherein step (a) is performed sequentially with irradiating the layer with electromagnetic energy.

9. The method of claim 1, wherein the electromagnetic energy comprises a wavelength between about 400 nm and about 1000 nm.

10. The method of claim 1, wherein the electromagnetic energy is generated by a light source comprising one of: a xenon flash lamp, a xenon short-arc lamp, a super high-pressure UV lamp, a high-pressure UV lamp, a low-pressure UV lamp, a rare gas fluorescent lamp, a metal halide lamp, a XeF laser, or a GaAs/GaAlAs laser.

11. A method of modifying a dielectric layer having (i) features etched thereon and (ii) a low dielectric constant, the layer being carried by a semiconductor substrate, the method comprising performing, while the etched features are exposed and have first dimensions, irradiating the layer with electromagnetic energy having a wavelength greater than about 300 nanometers (nm) and performing at least one of:
    (a) applying thermal energy to the layer to cause the layer temperature to be between 100 C and 400 C;
    (b) irradiating the layer with free ions; and
    metallizing the etched features having the first dimensions.

12. The method of claim 11, wherein step (a) is performed.

13. The method of claim 12, wherein step (a) is performed, and
    the thermal energy causes the layer temperature to be between about 190 C and about 210 C.

14. The method of claim 12, wherein step (b) is performed, and the layer is irradiated with H+ ions.

15. The method of claim 12, wherein only one of steps (a) or (b) is performed.

16. The method of claim 11, wherein the electromagnetic energy comprises a wavelength between about 400 nm and about 1000 nm.

17. The method of claim 11, wherein the electromagnetic energy is generated by a light source comprising one of: a xenon flash lamp, a xenon short-arc lamp, a super high-pressure UV lamp, a high-pressure UV lamp, a low-pressure UV lamp, a rare gas fluorescent lamp, a metal halide lamp, a XeF laser, or a GaAs/GaAlAs laser.

18. A method of making a semiconductor device comprising:
   depositing an etch stop layer on a semiconductor substrate;
   depositing a low k dielectric material layer on the etch stop layer;
   covering a portion of the low k dielectric material layer with a photoresist mask;
   etching uncovered portions of the low k dielectric material layer to form etched features in the low k dielectric material;
   lowering surface energy of the etched low k dielectric material; and substantially preventing deposits resulting from by-products of the etching step from forming on the etched low k dielectric material layer.

19. The method of claim 18, further comprising:
   wet stripping the etched low k dielectric material layer;
   mechanically removing the wet stripping agent; and
   performing a metallization process on the etched features of the low k dielectric material layer.

20. The method of claim 18, wherein lowering surface energy of the etched low k dielectric material comprises performing at least one of:
   (a) applying thermal energy to the layer to cause the layer temperature to be between 100 C and 400 C;
   (b) irradiating the layer with electromagnetic energy; or
   (c) irradiating the layer with free ions.

* * * * *